(12) United States Patent
Zheng et al.

(10) Patent No.: US 8,187,915 B2
(45) Date of Patent: May 29, 2012

(54) ARYL DICARBOXYLIC ACID DIIMIDAZOLE-BASED COMPOUNDS AS N-TYPE SEMICONDUCTOR MATERIALS FOR THIN FILM TRANSISTORS

(75) Inventors: Shiying Zheng, Webster, NY (US);
Deepak Shukla, Webster, NY (US);
Diane C. Freeman, Pittsford, NY (US)

(73) Assignee: Eastman Kodak Company, Rochester, NY (US)

( * ) Notice: Subject to any disclaimer, the term of this patent is extended or adjusted under 35 U.S.C. 154(b) by 161 days.

(21) Appl. No.: 12/731,191

(22) Filed: Mar. 25, 2010

(65) Prior Publication Data
US 2010/0178728 A1 Jul. 15, 2010

Related U.S. Application Data

(62) Division of application No. 11/748,622, filed on May 15, 2007, now Pat. No. 7,745,821.

(51) Int. Cl.
*H01L 51/40* (2006.01)
(52) U.S. Cl. ............... 438/99; 257/40; 257/E51.001
(58) Field of Classification Search ............. 257/40, 257/E51.001; 438/99
See application file for complete search history.

(56) References Cited

U.S. PATENT DOCUMENTS

| 6,387,727 | B1 | 5/2002 | Katz et al. |
| 2002/0164835 | A1 | 11/2002 | Dimitrakopoulos et al. |
| 2005/0039274 | A1 | 2/2005 | Yang et al. |
| 2006/0281924 | A1 | 12/2006 | Yang et al. |
| 2009/0166614 | A1 | 7/2009 | Konemann et al. |

FOREIGN PATENT DOCUMENTS

| JP | 05249718 A | 9/1993 |
| JP | 05308145 A | 11/1993 |

OTHER PUBLICATIONS

Machine translation—JP 05308145 A—Suzuki et al.
Machine translation—JP 05249718 A—Suzuki et al.

*Primary Examiner* — Anthony Ho
(74) *Attorney, Agent, or Firm* — J. Lanny Tucker

(57) ABSTRACT

A process for fabricating a thin film semiconductor device includes the following steps, but not necessarily in the noted order. Firstly, a thin film of organic semiconductor material is deposited onto a substrate. This thin film of organic semiconductor material comprises organic semiconductor material that comprises one or more aryl dicarboxylic diimidazole-based compounds of claim 1 such that the film exhibits a field effect electron mobility that is greater than 0.005 $cm^2/Vs$. Then, the process includes forming a spaced apart source electrode and drain electrode, wherein the source electrode and the drain electrode are separated by and electrically connected with, the n-channel semiconductor film. A gate electrode is then formed, spaced apart from the semiconductor material. One or more of the thin film semiconductor devices (or transistors) can be incorporated into an electronic device.

18 Claims, 1 Drawing Sheet

ARYL DICARBOXYLIC ACID DIIMIDAZOLE-BASED COMPOUNDS AS N-TYPE SEMICONDUCTOR MATERIALS FOR THIN FILM TRANSISTORS

CROSS-REFERENCE TO RELATED APPLICATIONS

This application is a divisional of U.S. patent application Ser. No. 11/748,622, filed May 15, 2007 U.S. Pat. No. 7,745,821, now allowed, which is incorporated herein by reference in its entirety.

FIELD OF THE INVENTION

The present invention relates to the use of aryl dicarboxylic acid diimidazole-based compounds as semiconductor materials in n-channel semiconductor films for thin film transistors. The invention relates to the use of these materials in thin film transistors for electronic devices and methods of making such transistors and devices.

BACKGROUND OF THE INVENTION

Thin film transistors (TFTs) are widely used as a switching element in electronics, for example, in active-matrix liquid-crystal displays, smart cards, and a variety of other electronic devices and components thereof. The thin film transistor (TFT) is an example of a field effect transistor (FET). The best-known example of an FET is the MOSFET (Metal-Oxide-Semiconductor-FET), today's conventional switching element for high-speed applications. Presently, most thin film devices are made using amorphous silicon as the semiconductor. Amorphous silicon is a less expensive alternative to crystalline silicon. This fact is especially important for reducing the cost of transistors in large-area applications. Application of amorphous silicon is limited to low speed devices, however, since its maximum mobility (0.5-1.0 $cm^2$/V sec) is about a thousand times smaller than that of crystalline silicon.

Although amorphous silicon is less expensive than highly crystalline silicon for use in TFTs, amorphous silicon still has its drawbacks. The deposition of amorphous silicon, during the manufacture of transistors, requires relatively costly processes, such as plasma enhanced chemical vapor deposition and high temperatures (about 360° C.) to achieve the electrical characteristics sufficient for display applications. Such high processing temperatures disallow the use, for deposition, of substrates made of certain plastics that otherwise might be desirable for flexible displays.

In the past decade, organic materials have received attention as a potential alternative to inorganic materials such as amorphous silicon for use in semiconductor channels of TFTs. Organic semiconductor materials are simpler to process, especially those that are soluble in organic solvents and, therefore, capable of being applied to large areas by far less expensive processes, such as spin-coating, dip-coating, ink jet printing, and microcontact printing. Furthermore, organic materials may be deposited at lower temperatures, opening up a wider range of substrate materials, including plastics, for flexible electronic devices. Accordingly, thin film transistors made of organic materials can be viewed as a potential key technology for plastic circuitry in display drivers, portable computers, pagers, memory elements in transaction cards, and identification tags, where ease of fabrication or mechanical flexibility are important considerations.

Organic materials for use as potential semiconductor channels in TFTs are disclosed, for example, in U.S. Pat. No. 5,347,144 to Garnier et al., entitled "Thin-Layer Field-Effect Transistors with MIS Structure Whose Insulator and Semiconductors Are Made of Organic Materials."

Organic semiconductor materials that can be used in TFTs to provide the switching and/or logic elements in electronic components typically require significant mobilities, well above 0.01 $cm^2$/Vs, and current on/off ratios (hereinafter referred to as "on/off ratios") greater than 1000. Organic TFTs having such properties are capable of use for electronic applications such as pixel drivers for displays and identification tags. However, most of the compounds exhibiting these desirable properties are "p-type" or "p-channel," meaning that negative gate voltages, relative to the source voltage, are applied to induce positive charges (holes) in the channel region of the device. N-type organic semiconductor materials can be used in TFTs as an alternative to p-type organic semiconductor materials, where the terminology "n-type" or "n-channel" indicates that positive gate voltages, relative to the source voltage, are applied to induce negative charges in the channel region of the device.

Moreover, one important type of TFT circuit, known as a complementary circuit, requires an n-type semiconductor material in addition to a p-type semiconductor material. See Dodabalapur et al. in "Complementary circuits with organic transistors" *Appl. Phys. Lett.* 1996, 69, 4227. In particular, the fabrication of complementary circuits requires at least one p-channel TFT and at least one n-channel TFT. Simple components such as inverters have been realized using complementary circuit architecture. Advantages of complementary circuits, relative to ordinary TFT circuits, include lower power dissipation, longer lifetime, and better tolerance of noise. In such complementary circuits, it is often desirable to have the mobility and the on/off ratio of an n-channel device to be similar in magnitude to the mobility and the on/off ratio of a p-channel device. Hybrid complementary circuits using an organic p-type semiconductor and an inorganic n-type semiconductor are known, as described in Dodabalapur et al. (*Appl. Phys. Lett.* 1996, 68, 2264.), but for ease of fabrication, an organic re-channel semiconductor material would be desired in such circuits.

Only a limited number of organic materials have been developed for use as a semiconductor n-channel in TFTs. One such material buckminsterfullerene C60 exhibits a mobility of 0.08 $cm^2$/Vs but is considered to be unstable in air. See R. C. Haddon, A. S. Perel, R. C. Morris, T. T. M. Palstra, A. F. Hebard and R. M. Fleming, "$C_{60}$ Thin Film Transistors" *Appl. Phys. Let.* 1995, 67, 121. Perfluorinated copper phthalocyanine has a mobility of 0.03 $cm^2$/Vs, and is generally stable to air operation, but substrates must be heated to temperatures above 100° C. in order to maximize the mobility in this material. See "New Air-Stable n-Channel Organic Thin Film Transistors" Z. Bao, A. J. Lovinger, and J. Brown *J. Am. Chem., Soc.* 1998, 120, 207. Other n-channel semiconductors, including some based on a naphthalene framework, have also been reported, but with lower mobilities. See Laquindanum et al., "n-Channel Organic Transistor Materials Based on Naphthalene Frameworks," *J. Am. Chem., Soc.* 1996, 118, 11331. One such naphthalene-based n-channel semiconductor material, tetracyanonaphthoquino-dimethane (TCNQD), is capable of operation in air, but the material has displayed a low on/off ratio and is also difficult to prepare and purify.

Aromatic tetracarboxylic diimides, based on a naphthalene aromatic framework, have also been demonstrated to provide, as an n-type semiconductor, n-channel mobilities greater than 0.1 $cm^2$/Vs using top-contact configured devices where the source and drain electrodes are on top of the semiconductor.

Comparable results could be obtained with bottom contact devices, that is, where the source and drain electrodes are underneath the semiconductor, but a thiol underlayer needed to be applied between the electrodes, which had to be gold, and the semiconductor. See Katz et al. "Naphthalenetetracarboxylic Diimide-Based n-Channel Transistor Semiconductors: Structural Variation and Thiol-Enhanced Gold Contacts" *J. Am. Chem. Soc.* 2000 122, 7787; "A Soluble and Air-stable Organic Semiconductor with High Electron Mobility" *Nature* 2000 404, 478; Katz et al., European Patent Application EP1041653 or U.S. Pat. No. 6,387,727. In the absence of the thiol underlayer, the mobility was found to be orders of magnitude lower in bottom-contact devices. Relatively higher mobilities have been measured in films of perylene tetracarboxylic diimides having linear alkyl side chains using pulse-radiolysis time-resolved microwave conductivity measurements. See Struijk et al. "Liquid Crystalline Peryllene Diimides: Architecture and Charge Carrier Mobilities" *J. Am. Chem. Soc. Vol.* 2000, 122, 11057. However, initial devices based on materials having a perylene framework used as the organic semiconductor led to devices with low mobilities, for example $10^{-5}$ cm$^2$/Vs for perylene tetracarboxylic dianhydride (PTCDA) and $1.5 \times 10^{-5}$ cm$^2$/Vs for NN'-diphenyl perylene tetracarboxylic acid diimide (PTCDI-Ph. See Horowitz et al. in "Evidence for n-Type Conduction in a Perylene Tetracarboxylic Diimide Derivative" *Adv. Mater.* 1996, 8, 242 and Ostrick, et al. *J Appl. Phys.* 1997, 81, 6804.

US Patent Pub. No. 2002/0164835 A1 to Dimitrakopoulos et al. discloses improved n-channel semiconductor films made of perylene tetracarboxylic acid diimide compounds, one example of which is N,N'-di(n-1H,1H-perfluorooctyl)perylene-3,4,9,10-tetracarboxylic acid diimide. Substituents attached to the imide nitrogens in the diimide structure comprise alkyl chains, electron deficient alkyl groups, electron deficient benzyl groups, the chains preferably having a length of four to eighteen atoms. U.S. Pat. No. 6,387,727 B1 to Katz et al. discloses fused-ring tetracarboxylic diimide compounds, one example of which is N,N'-bis(4-trifulormethyl benzyl)naphthalene-1,4,5,8,-tetracarboxylic acid diimide. Such compounds are pigments that are easier to reduce.

There is a need in the art for new and improved organic semiconductor materials for transistor materials and improved technology for their manufacture and use. There is especially a need for n-type semiconductor materials exhibiting significant mobilities and current on/off ratios in organic thin film transistor devices.

SUMMARY OF THE INVENTION

The present invention relates to the use, in n-channel semiconductor films for thin film transistors, aryl dicarboxylic diimidazole-based compounds as represented by the following structures:

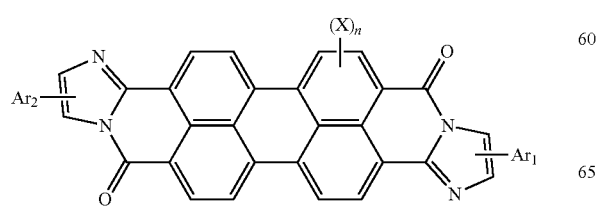

(I-A)

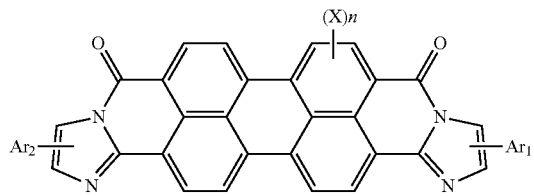

(I-B)

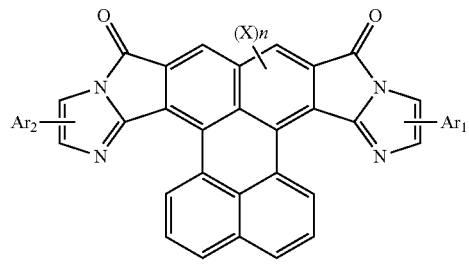

(II-A)

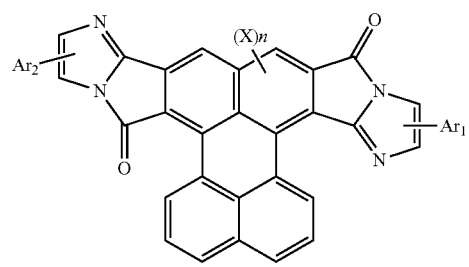

(II-B)

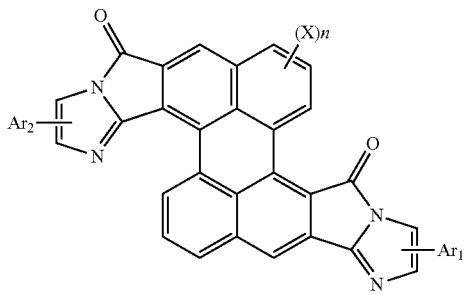

(III-A)

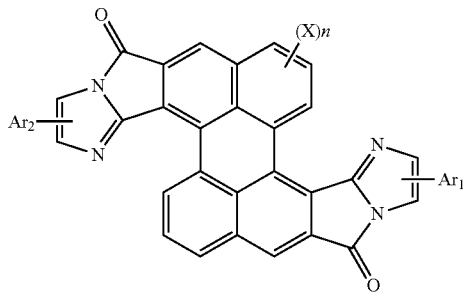

(III-B)

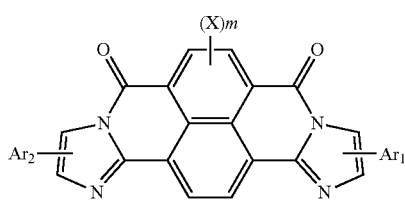

(IV-A)

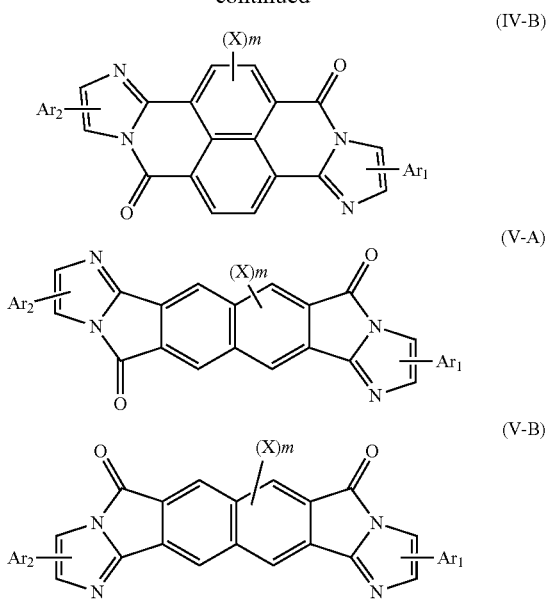

wherein $Ar_1$ and $Ar_2$ are the same or different, and are each carbocyclic or heterocyclic aromatic ring systems, each comprising 4 to 60 carbon atoms, fused to the adjacent imidazole ring, wherein each of $Ar_1$, and $Ar_2$ are substituted with one or more fluorine atoms; X is a substituent organic or inorganic group at any available position on the core nucleus; n is zero or an integer from 1 to 8 and m is zero or an integer from 1 to 4. The $Ar_1$ and $Ar_2$ moieties can be single rings or condensed or fused aromatic polycyclic ring systems, including carbocyclic, heterocyclic, or hybrid ring systems in which a carbocylic ring is fused to a heterocyclic ring.

Such films are capable of exhibiting field-effect electron mobility greater than $10^{-3}$ $cm^2/Vs$ in the film form. Such semiconductor films are also capable of providing device on/off ratios in the range of at least $10^3$.

Another aspect of the present invention is the use of such n-channel semiconductor films in thin film transistors, each such transistor further comprising spaced apart first and second contact connected to an n-channel semiconductor film, and a third contact means spaced from said first and second contact means that is adapted for controlling, by means of a voltage applied to the third contact means, a current between the first and second contact means through said film. The first, second, and third contact means can correspond to a drain, source, and gate electrode in a field effect transistor. More specifically, an organic thin film transistor (OTFT) has an organic semiconductor layer. Any known thin film transistor construction option is possible with the invention.

Another aspect of the present invention is directed to a process for fabricating a thin film transistor, preferably by sublimation or solution-phase deposition of the n-channel semiconductor film onto a substrate.

Furthermore, preferred compounds used in the present invention possess significant volatility so that vapor phase deposition, where desired, is available to apply the n-channel semiconductor films to a substrate in an organic thin film transistor.

As used herein, "a" or "an" or "the" are used interchangeably with "at least one," to mean "one or more" of the element being modified.

As used herein, the terms "over," "above," and "under" and the like, with respect to layers in the inkjet media, refer to the order of the layers over the support, but do not necessarily indicate that the layers are immediately adjacent or that there are no intermediate layers.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical or analogous features that are common to the figures, and wherein.

DESCRIPTION OF THE INVENTION

Figure 1:
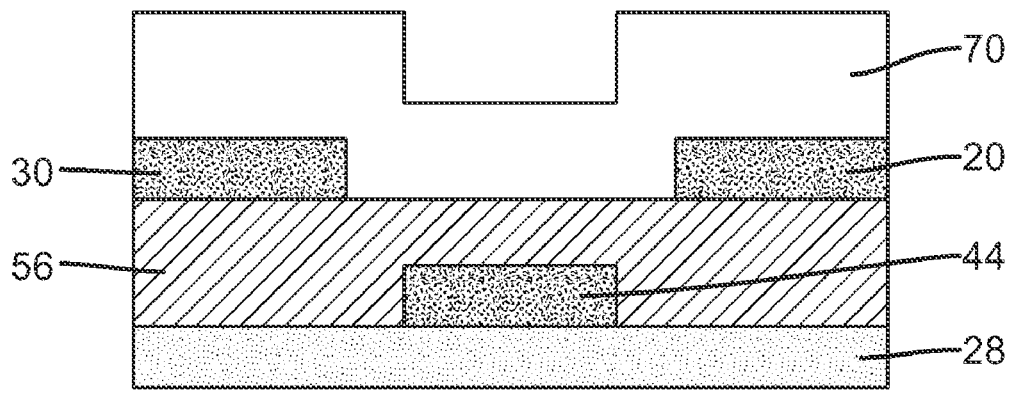
FIG. 1 illustrates a cross-sectional view of a typical organic thin film transistor having a bottom contact configuration.
Figure 2:
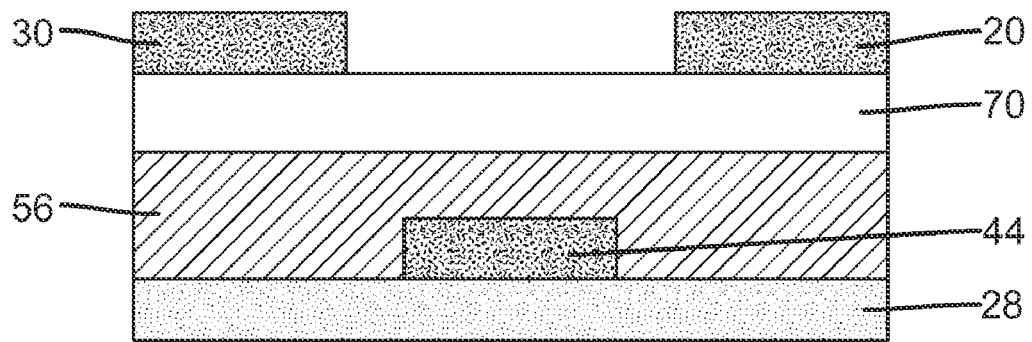
FIG. 2 illustrates a cross-sectional view of a typical organic thin film transistor having a top contact configuration.

Cross-sectional views of typical organic thin film transistors are shown in FIGS. 1 and 2, wherein in FIG. 1 illustrates a typical bottom contact configuration and FIG. 2 illustrates a typical top contact configuration.

Each thin film transistor (TFT) in FIGS. 1 and 2 contains a source electrode 20, a drain electrode 30, a gate electrode 44, a gate dielectric 56, a substrate 28, and the semiconductor 70 of the invention in the form of a film connecting the source electrode 20 to drain electrode 30, which semiconductor comprises a compound selected from the class of arylimidazole-based compounds described herein.

When the TFT operates in an accumulation mode, the charges injected from the source 20 into the semiconductor are mobile and a current flows from source to drain, mainly in a thin channel region within about 100 Angstroms of the semiconductor-dielectric interface. See A. Dodabalapur, L. Torsi H. E. Katz, Science 1995, 268, 270, hereby incorporated by reference. In the configuration of FIG. 1, the charge need only be injected laterally from the source 20 to form the channel. In the absence of a gate field the channel ideally has few charge carriers; as a result there is ideally no source-drain conduction.

The off current is defined as the current flowing between the source electrode 20 and the drain electrode 30 when charge has not been intentionally injected into the channel by the application of a gate voltage. For an accumulation-mode TFT, this occurs for a gate-source voltage more negative, assuming an n-channel, than a certain voltage known as the threshold voltage. See Sze in Semiconductor Devices—Physics and Technology, John Wiley & Sons (1981), pages 438-443. The on current is defined as the current flowing between the source 20 and the drain 30 when charge carriers have been accumulated intentionally in the channel by application of an appropriate voltage to the gate electrode, and the channel is conducting. For an n-channel accumulation-mode TFT, this occurs at gate-source voltage more positive than the threshold voltage. It is desirable for this threshold voltage to be zero, or slightly positive, for re-channel operation. Switching between on and off is accomplished by the application and removal of an electric field from the gate electrode 44 across the gate dielectric 56 to the semiconductor-dielectric interface, effectively charging a capacitor.

In accordance with the invention, the organic semiconductor materials used in the present invention, when used in the form of an n-channel film, can exhibit high performance under ambient conditions without the need for special chemical underlayers.

The improved n-channel semiconductor film of the present invention, comprising arylimidazole-based compounds described herein, is capable of exhibiting a field effect electron mobility greater than $10^{-4}$ cm$^2$/Vs, preferably greater than $10^{-3}$ cm$^2$/Vs. In addition, the n-channel semiconductor film of the invention is capable of providing on/off ratios of at least $10^2$, advantageously at least $10^3$. The on/off ratio is measured as the maximum/minimum of the drain current as the gate voltage is swept from zero to 80 volts and the drain-source voltage is held at a constant value of 80 volts, and employing a silicon dioxide gate dielectric.

Moreover, these properties are attainable after repeated exposure of the n-type semiconductor material to air, before film deposition, as well as exposure of the transistor device and/or the channel layer to air after deposition.

The n-channel semiconductor materials used in the present invention offer advantages a class of compounds that have not been as semiconductor in a TFT.

The lowest lying unoccupied molecular orbital of the compound is at an energy that allows for injection of electrons at useful voltages from metals with reasonable work functions. This conjugated structure generally has a desirable lowest unoccupied molecular orbital (LUMO) energy level of about 3.5 eV to about 4.6 eV with reference to the vacuum energy level. As known in the art, LUMO energy level and reduction potential approximately describe the same characteristics of a material. LUMO energy level values are measured with reference to the vacuum energy level, and reduction potential values are measured in solution versus a standard electrode. An advantage for device applications is that the LUMO in the crystalline solid, which is the conduction band of the semiconductor, and the electron affinity of the solid, are both measured with reference to the vacuum level. The latter parameters are usually different from the former parameters, which are obtained from solution.

In one embodiment of the present invention, the arylimidazole-based compounds are represented by the following structures aryl dicarboxylic diimidazole-based compounds having 6 to 10 fused rings as represented by the following structures:

(I-A)

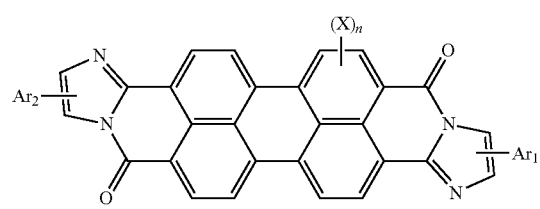

(I-B)

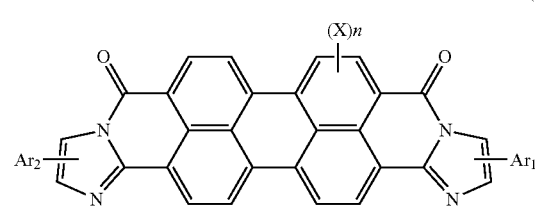

(II-A)

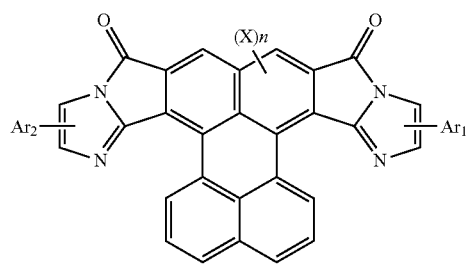

(II-B)

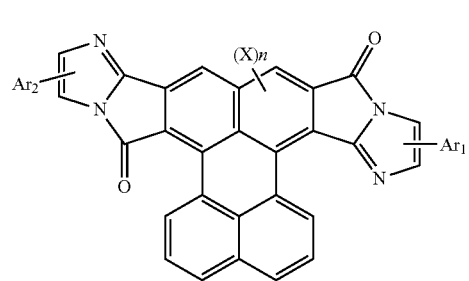

(III-A)

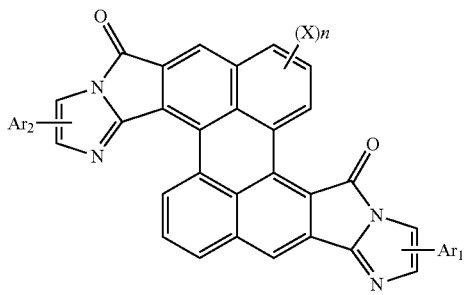

(III-B)

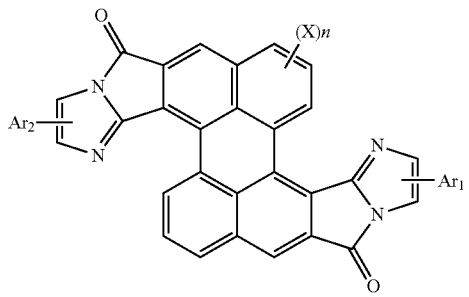

(IV-A)

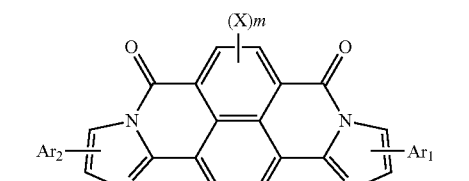

(IV-B)

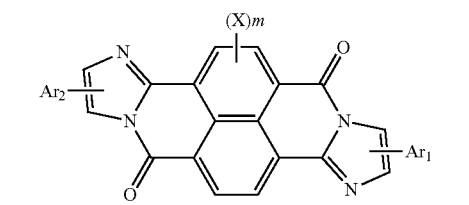

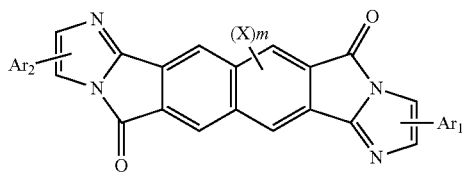

(V-A)

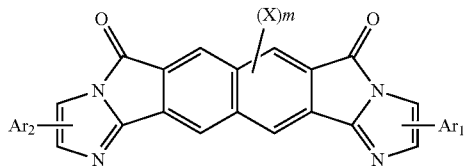

(V-B)

wherein $Ar_1$ and $Ar_2$ are the same or different, and are each carbocyclic or heterocyclic aromatic ring systems, comprising 4 to 60 carbon atoms, fused to each corresponding adjacent imidazole ring in the structure, wherein each of $Ar_1$, and $Ar_2$ are substituted with at least one or more fluorine atoms; X is a substituent organic or inorganic group at any available position on the core nucleus; n is an integer from 1 to 8 and m is an integer from 1 to 4. The $Ar_1$ and $Ar_2$ moieties can be single rings or condensed or fused aromatic polycyclic ring systems, including carbocyclic, heterocyclic, or hybrid ring systems in which a carbocylic ring is fused to a heterocyclic ring. For example, $Ar_1$ and $Ar_2$ can be a benzo, naphthaleno, peryleno, thiopheno, pyridino, furano, pyrazolo, or anthraceno moiety.

In another preferred embodiment, $Ar_1$ and $Ar_2$ are substituted or un-substituted benzo, benzothiophene, quinolino, thiopheno, or naphthaleno moieties each substituted with one or more fluorine-atoms. Examples of fluorine-containing groups include fluorinated carbocyclic or heterocyclic aromatic rings preferably having 5-10 ring atoms, more preferably 5 to 6 ring atoms (most preferably phenyl), or any combinations thereof. Finally, in yet another preferred embodiment, $Ar_1$ and $Ar_2$ are each a benzo moiety substituted by one or more fluorine-containing groups.

Additional optional substituents on $Ar_1$, and $Ar_2$ include, for example, alkyl groups, alkenyl, alkoxy groups, cyano, aryl, arylalkyl or any other groups that do not affect the n-type semiconductor properties of the film made from such compounds. It is advantageous to avoid substituents that tend to interfere with close approach of the conjugated cores of the compounds in a stacked arrangement of the molecules that is conducive to semiconductor properties. Such substituents include highly branched groups, ring structures and groups having more than 12 atoms, particularly where such groups or rings would be oriented to pose a significant steric barrier to the close approach of the conjugated cores. In addition, substituent groups should be avoided that substantially lower the solubility and/or volatility of the compounds such that the desirable fabrication processes are prevented.

Unless otherwise specifically stated, use of the term "substituted" or "substituent" means any group or atom other than hydrogen. Additionally, when the term "group" is used, it means that when a substituent group contains a substitutable hydrogen, it is also intended to encompass not only the substituent's unsubstituted form, but also its form to the extent it can be further substituted (up to the maximum possible number) with any substituent group or groups so long as the substituent does not destroy properties necessary for semiconductor utility. If desired, the substituents may themselves be further substituted one or more times with acceptable substituent groups. For example, an alkyl or alkoxy group can be substituted with one or more fluorine atoms. When a molecule may have two or more substituents, the substituents may be joined together to form an aliphatic or unsaturated ring such as a fused ring unless otherwise provided.

Examples of any of the alkyl groups mentioned above are methyl, ethyl, propyl, isopropyl, butyl, isobutyl, t-butyl, pentyl, hexyl, octyl, 2-ethylhexyl, and congeners. Alkyl groups, preferably having 1 to 6 carbon atoms, more preferably 1 to 4, are intended to include branched or linear groups. Alkenyl groups can be vinyl, 1-propenyl, 1-butenyl, 2-butenyl, and congeners. Aryl groups can be phenyl, naphthyl, styryl, and congeners. Arylalkyl groups can be benzyl, phenethyl, and congeners. Useful substituents on any of the foregoing or other groups disclosed include halogen, and alkoxy, and the like. Preferred substituents are electron-withdrawing groups such as a cyano group and fluorine groups.

In general Structures I to V (including A and B alternatives), it is advantageous to have the substituents on $Ar_1$ and $Ar_2$ groups that do not interfere with close approach of the conjugated core of the compounds. It is possible to have multiple substituents but still not interfere with their close approach in accordance with suitable stacking geometries. It is also possible that properly selected substituents will promote this desired close approach.

During synthesis both cis and trans isomers are formed because during the imidazole ring formation, the amine group can attack either one of the two carbonyl groups to form a statistical mixture. The isomers can be separated depending on the solubility and volatility of the two forms. If the properties of the two isomers are similar, then separation can be difficult. For example, GB925409 discloses a process to separate the cis and trans isomers using solubility difference.

In a preferred embodiment, mixtures of alternate A and B compounds of each of Structures I to V are used as the thin film semiconductor material. Mixtures of compounds from more than one of Structure I, II, III, IV, and V can also be used, for example, a mixture of compounds of Structure I-A, I-B, II-A, and II-B.

Specific illustrative examples of useful aryl dicarboxylic acid diimidazole-based compounds are shown by the formulae below:

Compound 1-A

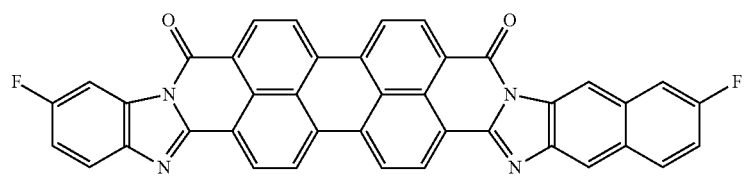

-continued
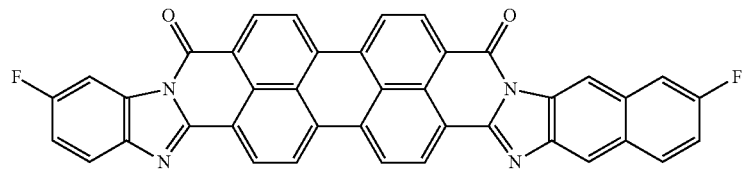
Compound 1-B
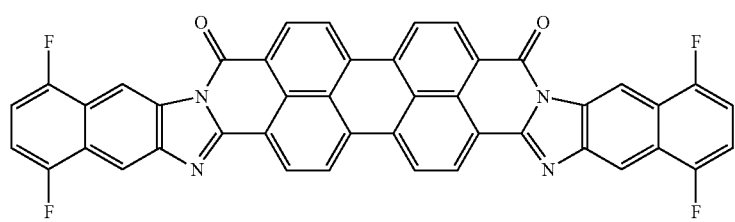
Compound 2-A
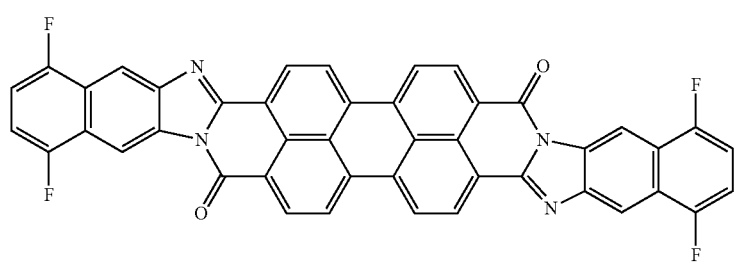
Compound 2-B
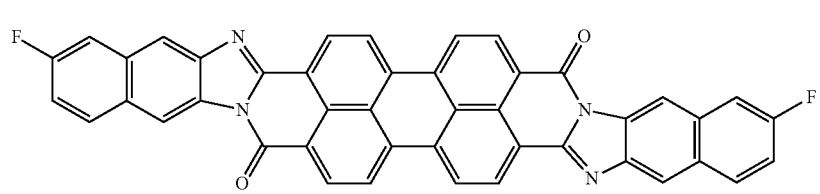
Compound 3-A
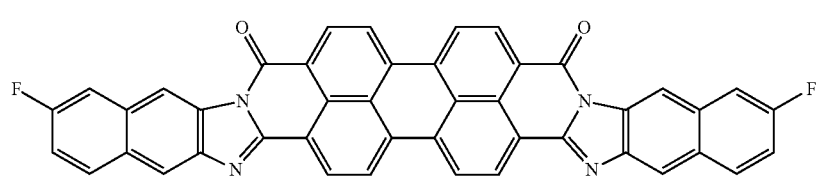
Compound 3-B
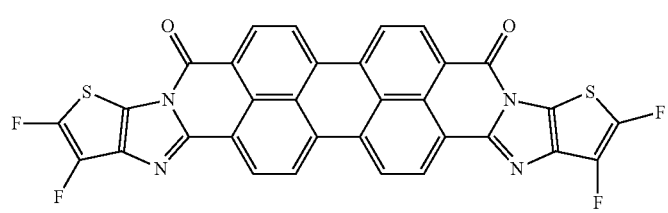
Compound 4-A
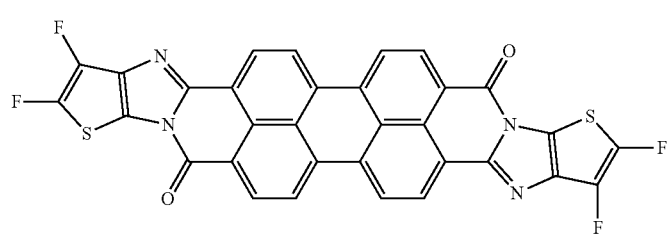
Compound 4-B -continued
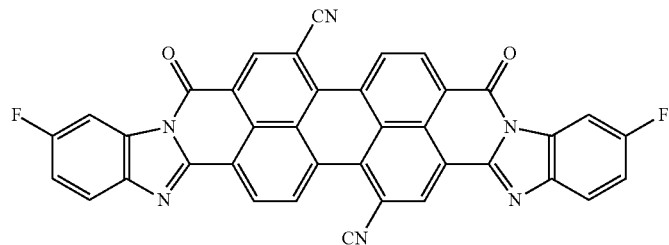
Compound 5-A
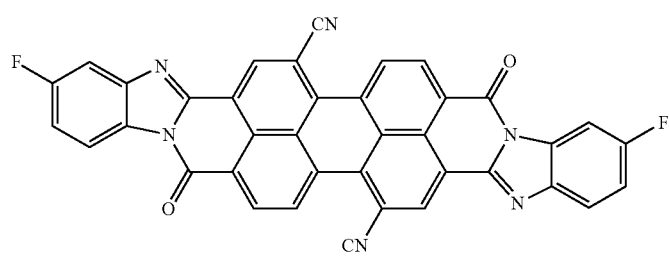
Compound 5-B
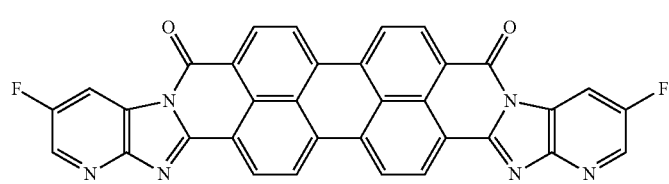
Compound 6-A
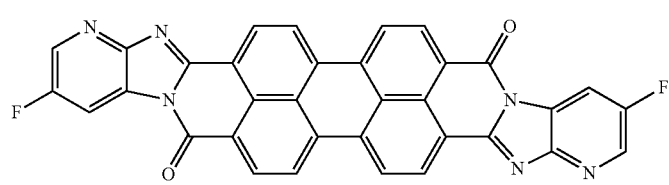
Compound 6-B
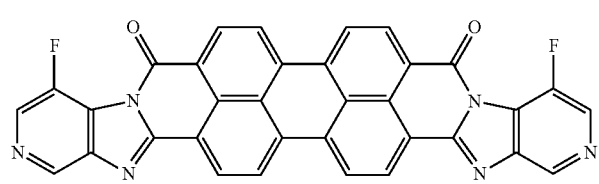
Compound 7-A
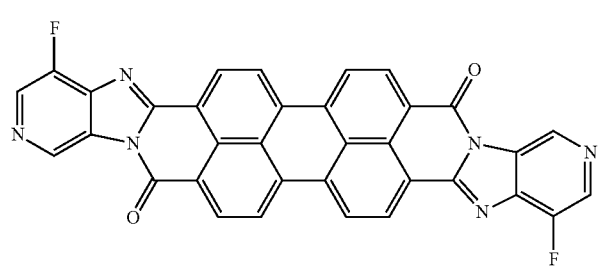
Compound 7-B
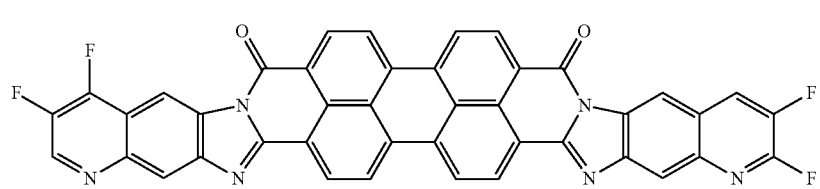
Comound 8-A -continued
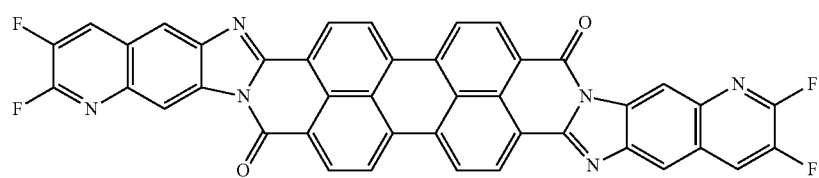
Compound 8-B
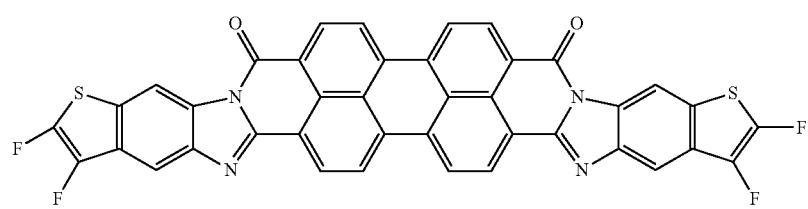
Compound 9-A
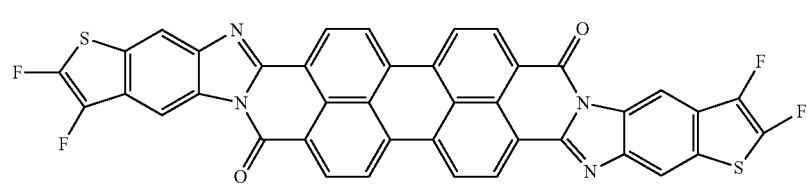
Compound 9-B
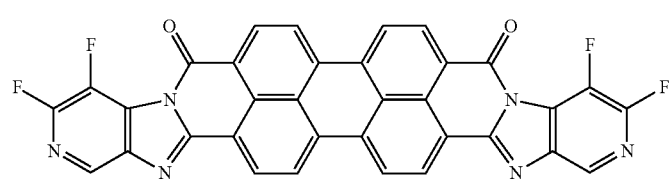
Compound 10-A
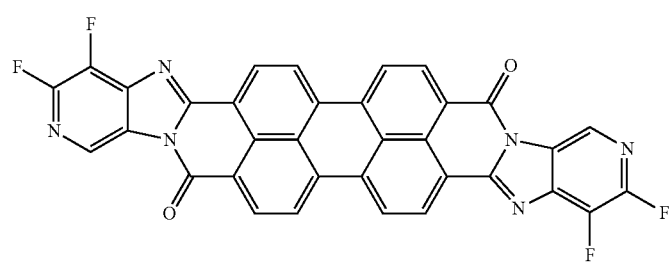
Compound 10-B
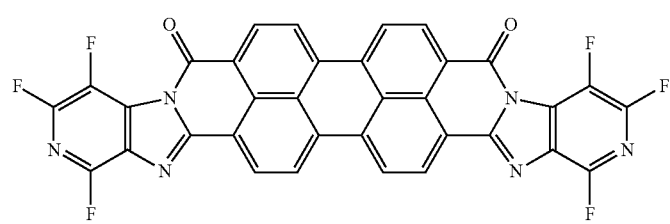
Compound 11-A
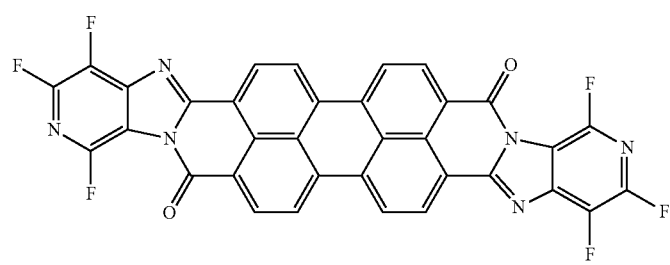
Comound 11-B -continued
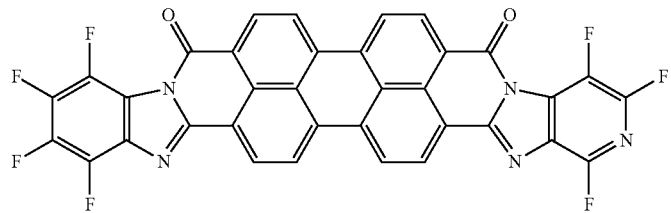
Compound 12
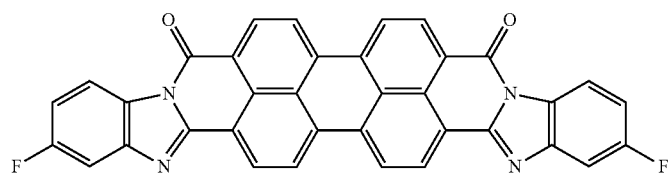
Compound 13-A
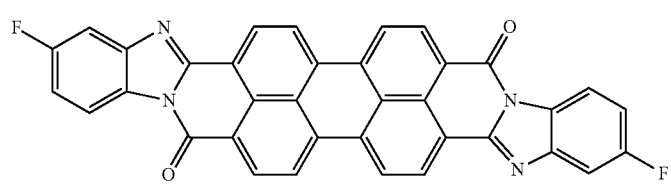
Compound 13-B
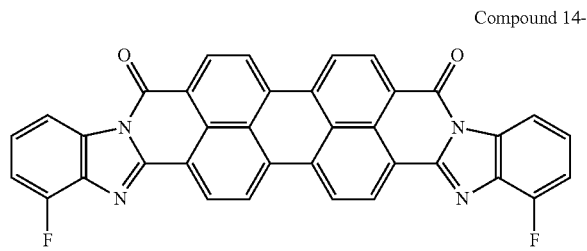
Compound 14-A
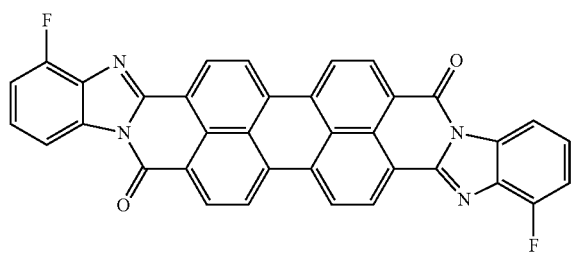
Compound 14-B
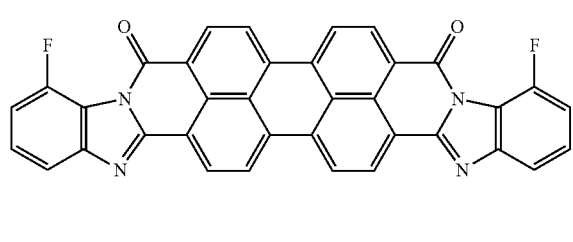
Compound 15-A
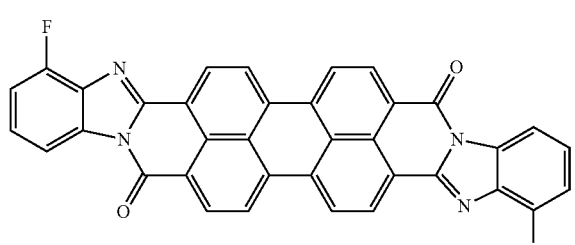
Compound 15-B
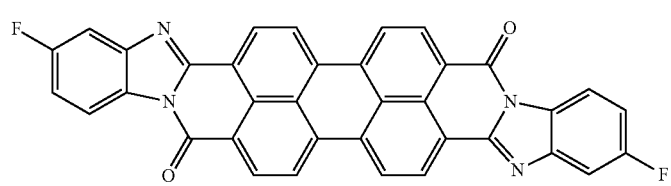
Comound 16-A
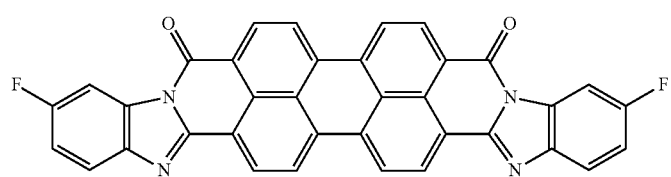
Compound 16-B -continued
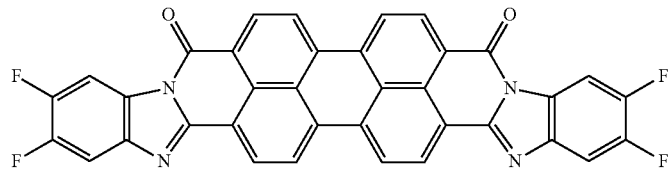
Compound 17-A
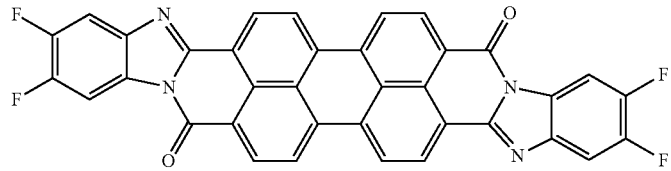
Compound 17-B
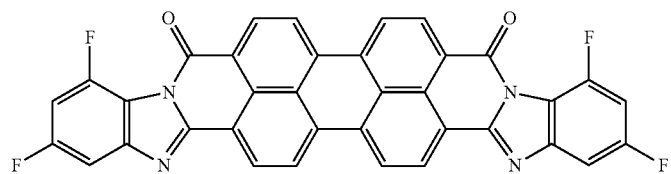
Compound 18-A
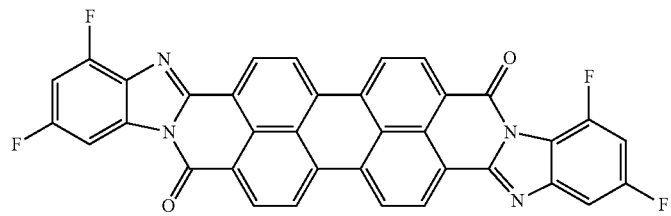
Compound 18-B
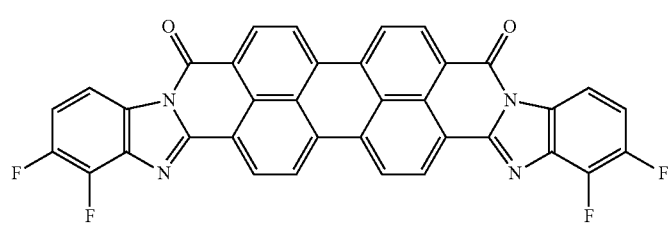
Compound 19-A
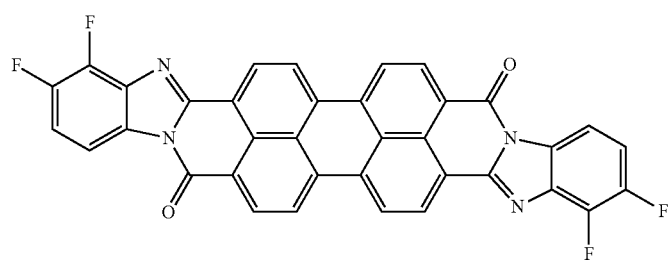
Compound 19-B
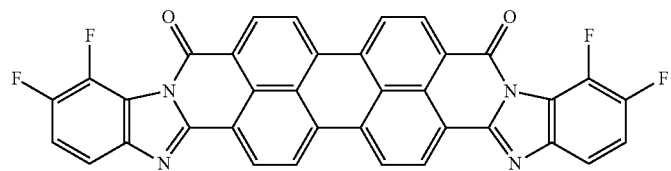
Compound 20-A
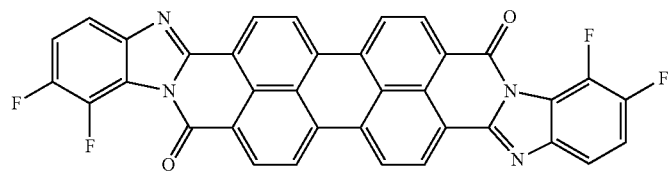
Compound 20-B -continued
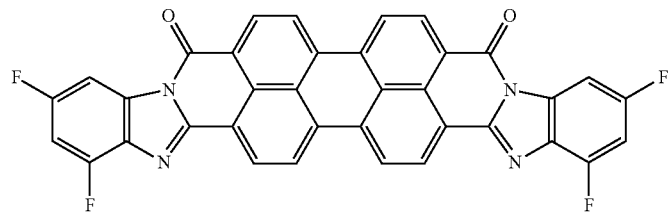
Compound 21-A
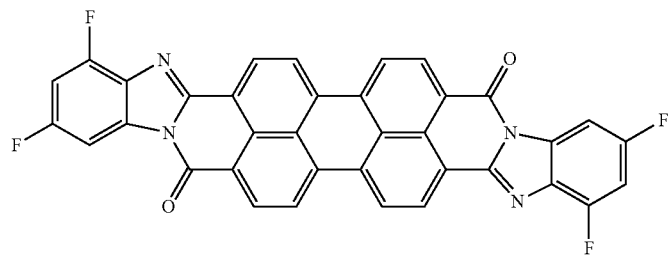
Compound 21-B
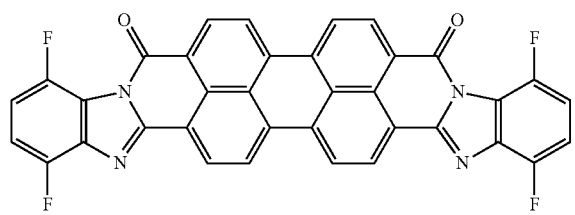
Compound 22-A
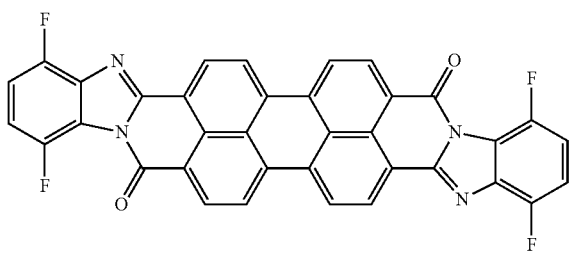
Compound 22-B
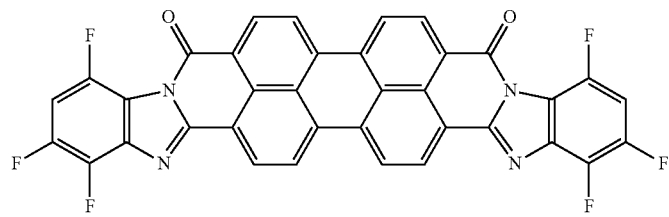
Compound 23
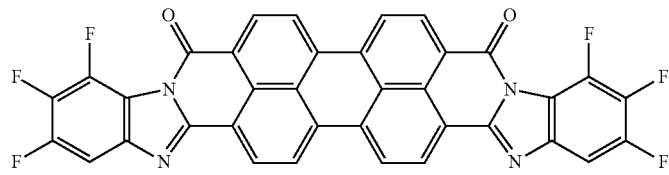
Compound 24
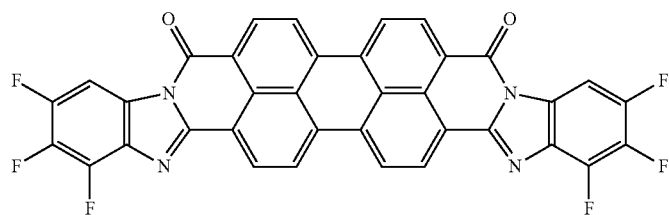
Compound 25
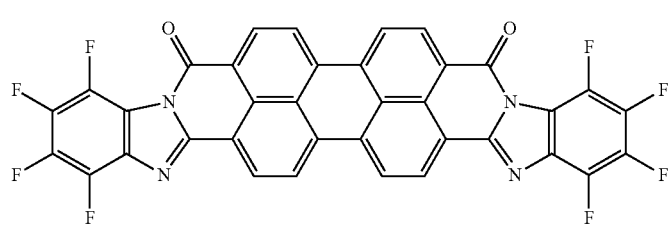
Compound 26-A -continued
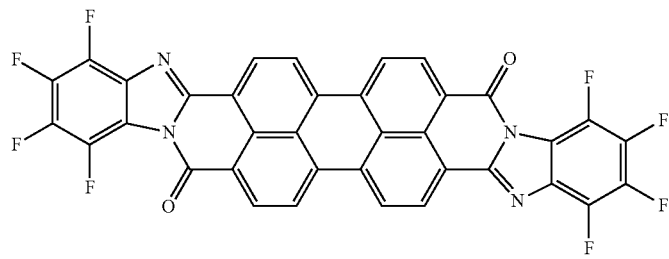
Compound 26-B
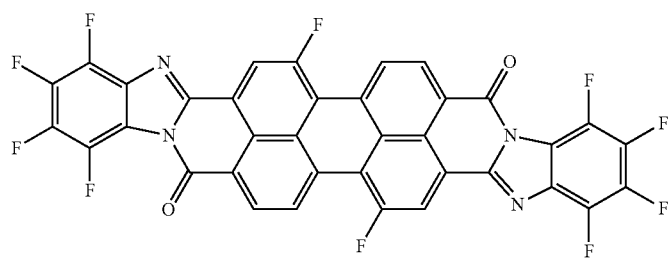
Compound 27-A
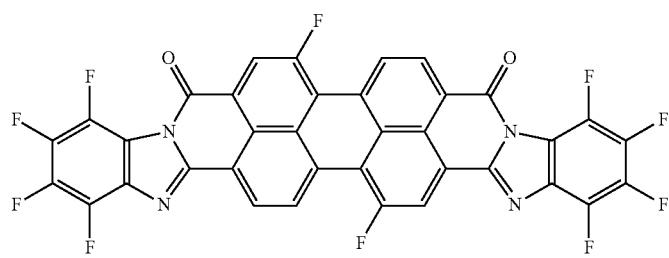
Compound 27-B
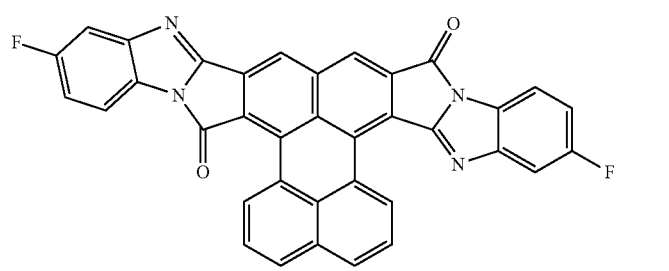
Compound 28-A
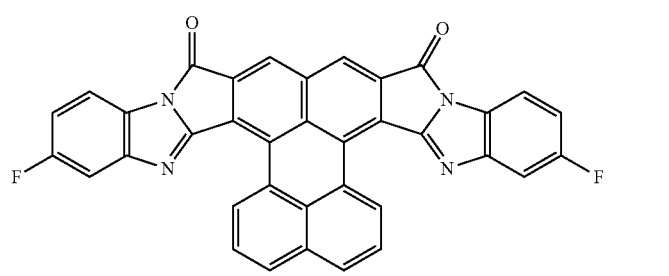
Compound 28-B
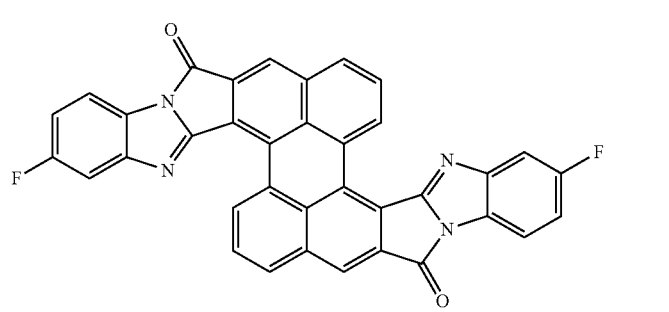
Compound 29-A -continued
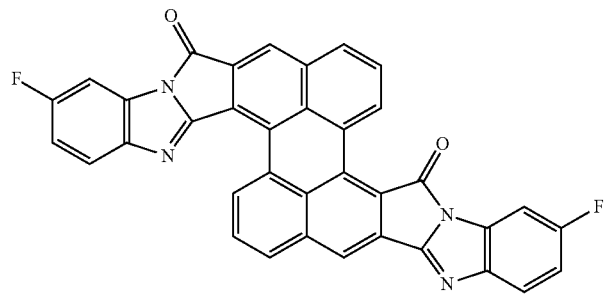
Compound 29-B
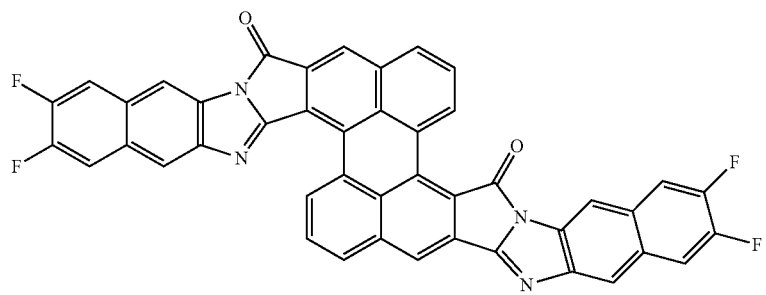
Compound 30-A
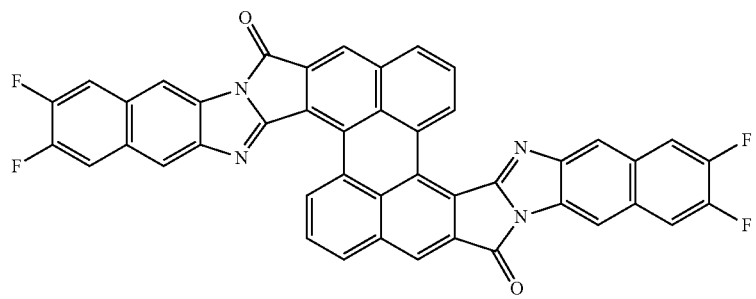
Compound 30-B
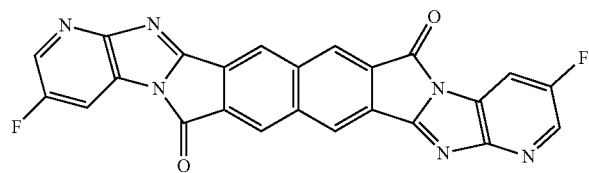
Compound 31-A
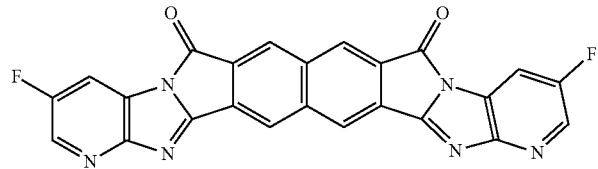
Compound 31-B
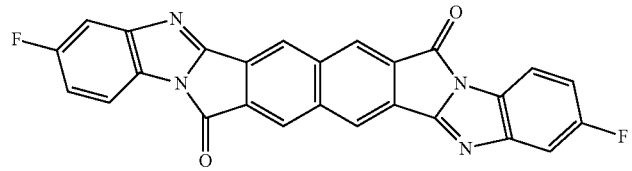
Compound 32-A
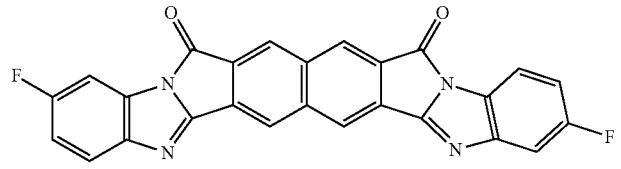
Compound 32-B -continued
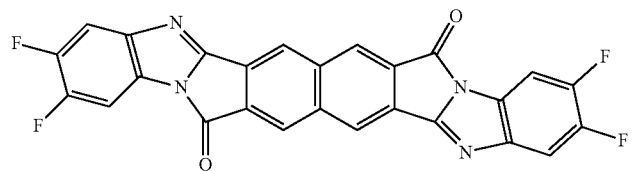
Compound 33-A
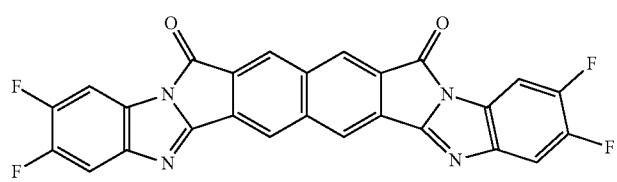
Compound 33-B
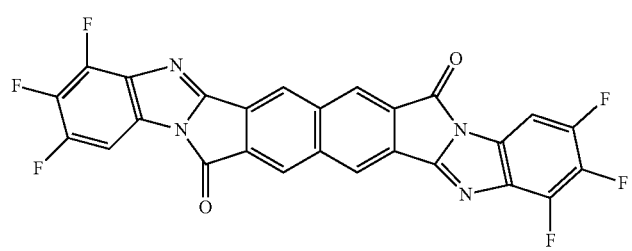
Compound 34-A
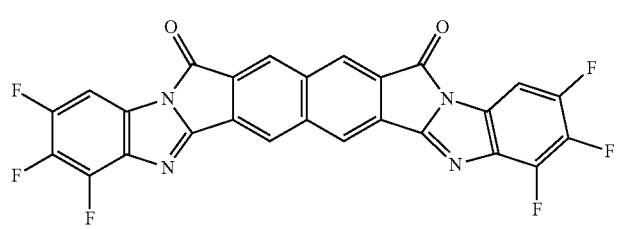
Compound 34-B
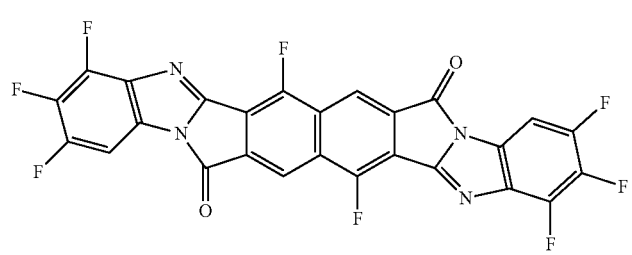
Compound 35-A
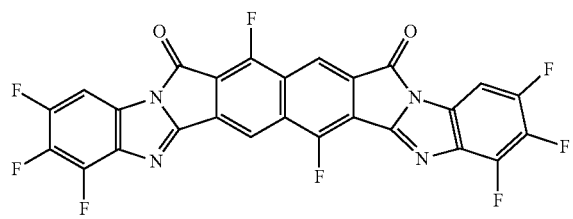
Compound 35-B
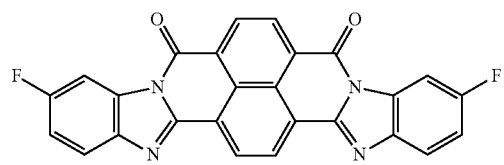
Compound 36-A
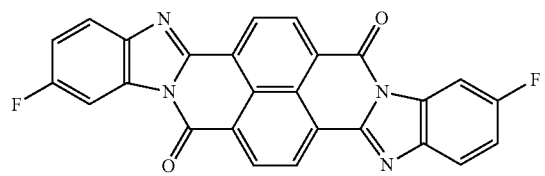
Compound 36-B
Compound 37-A -continued
Compound 37-B
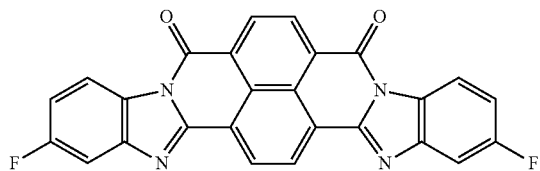
Compound 38-A
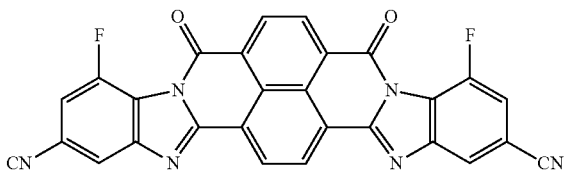
Compound 38-B
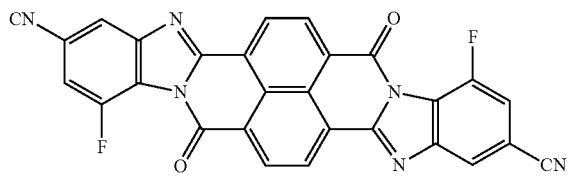
Compound 39-A
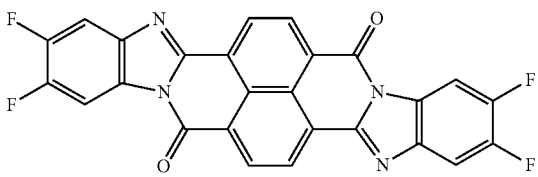
Compound 39-B
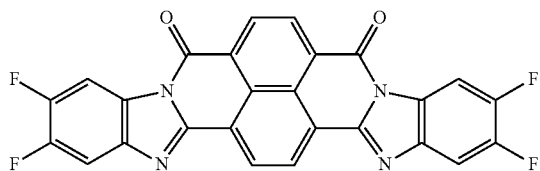
Compound 40-A
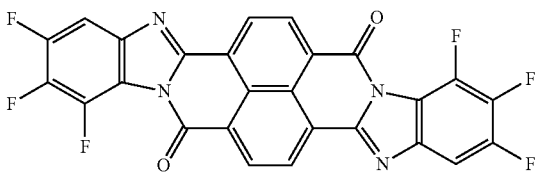
Compound 40-B
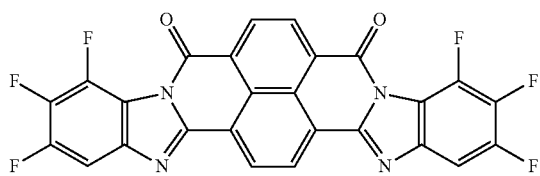
Compound 41-A
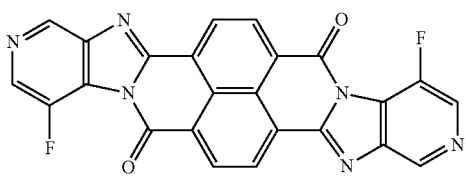
Compound 41-B
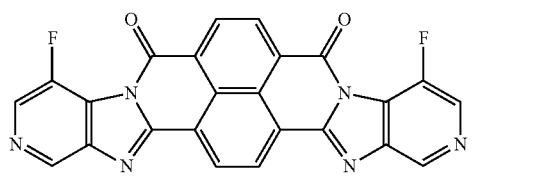
Compound 42-A
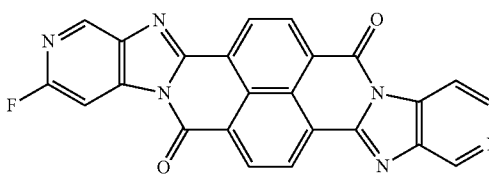
Compound 42-B
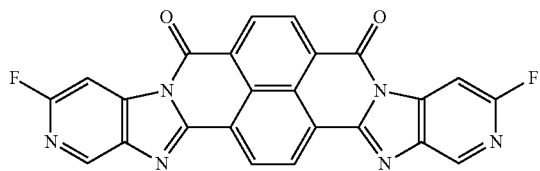
Compound 43-A
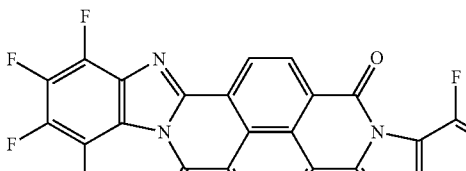
Compound 43-B
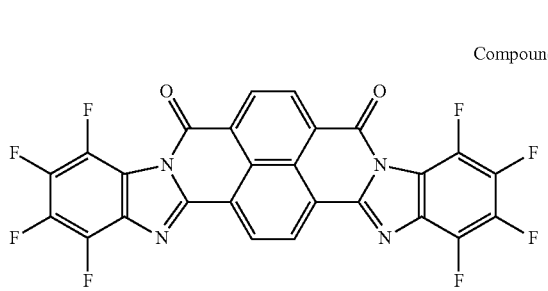
Compound 44-A
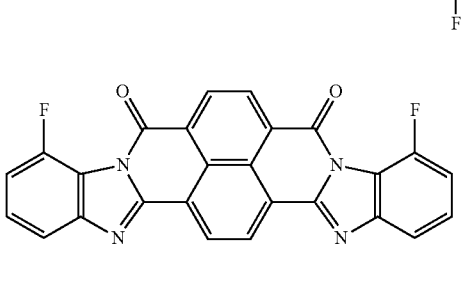

-continued

Compound 44-B

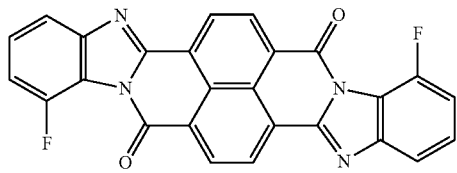

Compound 45-A

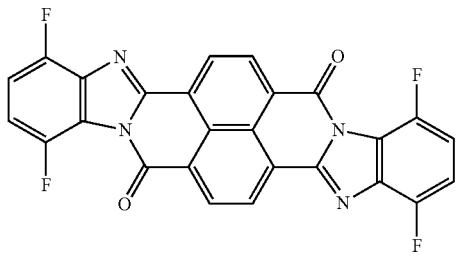

Compound 45-B

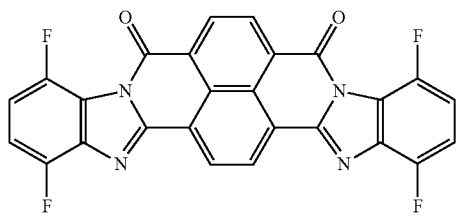

Another aspect of the invention relates to a process for making thin film semiconductor devices. In one embodiment, a substrate is provided and a layer of the semiconductor material as described above can be applied to the substrate, electrical contacts being made with the layer. The exact process sequence is determined by the structure of the desired semiconductor component. Thus, in the production of an organic field effect transistor, for example, a gate electrode can be first deposited on a flexible substrate, for example an organic polymer film, the gate electrode can then be insulated with a dielectric and then source and drain electrodes and a layer of the n-channel semiconductor material can be applied on top. The structure of such a transistor and hence the sequence of its production can be varied in the customary manner known to a person skilled in the art. Thus, alternatively, a gate electrode can be deposited first, followed by a gate dielectric, then the organic semiconductor can be applied, and finally the contacts for the source electrode and drain electrode deposited on the semiconductor layer. A third structure could have the source and drain electrodes deposited first, then the organic semiconductor, with dielectric and gate electrode deposited on top.

In yet another embodiment of the present invention, source drain and gate can all be on a common substrate and the gate dielectric can enclose gate electrode such that gate electrode is electrically insulated from source electrode and drain electrode, and the semiconductor layer can be positioned over the source, drain and dielectric.

The skilled artisan will recognize other structures can be constructed and/or intermediate surface modifying layers can be interposed between the above-described components of the thin film transistor. In most embodiments, a field effect transistor comprises an insulating layer, a gate electrode, a semiconductor layer comprising an organic material as described herein, a source electrode, and a drain electrode, wherein the insulating layer, the gate electrode, the semiconductor layer, the source electrode, and the drain electrode are in any sequence as long as the gate electrode and the semiconductor layer both contact the insulating layer, and the source electrode and the drain electrode both contact the semiconductor layer.

A support can be used for supporting the OTFT during manufacturing, testing, and/or use. The skilled artisan will appreciate that a support selected for commercial embodiments may be different from one selected for testing or screening various embodiments. In some embodiments, the support does not provide any necessary electrical function for the TFT. This type of support is termed a "non-participating support" in this document. Useful materials can include organic or inorganic materials. For example, the support may comprise inorganic glasses, ceramic foils, polymeric materials, filled polymeric materials, coated metallic foils, acrylics, epoxies, polyamides, polycarbonates, polyimides, polyketones, poly(oxy-1,4-phenyleneoxy-1,4-phenylenecarbonyl-1,4-phenylene) (sometimes referred to as poly(ether ether ketone) or PEEK), polynorbornenes, polyphenyleneoxides, poly(ethylene naphthalenedicarboxylate) (PEN), poly(ethylene terephthalate) (PET), poly(phenylene sulfide) (PPS), and fiber-reinforced plastics (FRP).

A flexible support is used in some embodiments of the present invention. This allows for roll processing, which may be continuous, providing economy of scale and economy of manufacturing over flat and/or rigid supports. The flexible support chosen preferably is capable of wrapping around the circumference of a cylinder of less than about 50 cm diameter, more preferably 25 cm diameter, most preferably 10 cm diameter, without distorting or breaking, using low force as by unaided hands. The preferred flexible support may be rolled upon itself.

In some embodiments of the invention, the support is optional. For example, in a top construction as in FIG. 2, when the gate electrode and/or gate dielectric provides sufficient support for the intended use of the resultant TFT, the support is not required. In addition, the support may be combined with a temporary support. In such an embodiment, a support may be detachably adhered or mechanically affixed to the support, such as when the support is desired for a temporary purpose, e.g., manufacturing, transport, testing, and/or storage. For example, a flexible polymeric support may be adhered to a rigid glass support, which support could be removed.

The gate electrode can be any useful conductive material. A variety of gate materials known in the art, are also suitable, including metals, degenerately doped semiconductors, conducting polymers, and printable materials such as carbon ink or silver-epoxy. For example, the gate electrode may comprise doped silicon, or a metal, such as aluminum, chromium, gold, silver, nickel, palladium, platinum, tantalum, and titanium. Conductive polymers also can be used, for example polyaniline, poly(3,4-ethylenedioxythiophene)/poly(styrene sulfonate) (PEDOT:PSS). In addition, alloys, combinations, and multilayers of these materials may be useful.

In some embodiments of the invention, the same material can provide the gate electrode function and also provide the support function of the support. For example, doped silicon can function as the gate electrode and support the OTFT.

The gate dielectric is provided on the gate electrode. This gate dielectric electrically insulates the gate electrode from the balance of the OTFT device. Thus, the gate dielectric comprises an electrically insulating material. The gate dielectric should have a dielectric constant above about 2, more preferably above about 5. The dielectric constant of the gate dielectric also can be very high if desired, for example, 80 to 100 or even higher. Useful materials for the gate dielectric may comprise, for example, an inorganic electrically insulating material. The gate dielectric may comprise a polymeric material, such as polyvinylidenedifluoride (PVDF), cyanocelluloses, polyimides, etc.

Specific examples of materials useful for the gate dielectric include strontiates, tantalates, titanates, zirconates, aluminum oxides, silicon oxides, tantalum oxides, titanium oxides, silicon nitrides, barium titanate, barium strontium titanate, barium zirconate titanate, zinc selenide, and zinc sulfide. In addition, alloys, combinations, and multilayers of these examples can be used for the gate dielectric. Of these materials, aluminum oxides, silicon oxides, and zinc selenide are preferred. In addition, polymeric materials such as polyimides are insulators that exhibit a high dielectric constant. Such insulators are discussed in U.S. Pat. No. 5,981,970 hereby incorporated by reference.

The gate dielectric can be provided in the OTFT as a separate layer, or formed on the gate such as by oxidizing the gate material to form the gate dielectric. The dielectric layer may comprise two or more layers having different dielectric constants.

The source electrode and drain electrode are separated from the gate electrode by the gate dielectric, while the organic semiconductor layer can be over or under the source electrode and drain electrode. The source and drain electrodes can be any useful conductive material. Useful materials include most of those materials described above for the gate electrode, for example, aluminum, barium, calcium, chromium, gold, silver, nickel, palladium, platinum, titanium, polyaniline, PEDOT:PSS, other conducting polymers, alloys thereof, combinations thereof, and multilayers thereof.

The thin film electrodes (e.g., gate electrode, source electrode, and drain electrode) can be provided by any useful means such as physical vapor deposition (e.g., thermal evaporation, sputtering) or ink jet printing. The patterning of these electrodes can be accomplished by known methods such as shadow masking, additive photolithography, subtractive photolithography, printing, microcontact printing, and pattern coating.

The organic semiconductor layer can be provided over or under the source and drain electrodes, as described above in reference to the thin film transistor article. The present invention also provides an integrated circuit comprising a plurality of OTFTs made by the process described herein.

The n-channel semiconductor material made using the above arylimidazole-based compounds are capable of being formed on any suitable substrate which can comprise the support and any intermediate layers such as a dielectric or insulator material, including those known in the art.

The entire process of making the thin film transistor or integrated circuit of the present invention can be carried out below a maximum support temperature of about 450° C., preferably below about 250° C., more preferably below about 150° C., and even more preferably below about 150° C., or even at temperatures around room temperature (about 25° C. to 70° C.). The temperature selection generally depends on the support and processing parameters known in the art, once one is armed with the knowledge of the present invention contained herein. These temperatures are well below traditional integrated circuit and semiconductor processing temperatures, which enables the use of any of a variety of relatively inexpensive supports, such as flexible polymeric supports. Thus, the invention enables production of relatively inexpensive integrated circuits containing organic thin film transistors with significantly improved performance.

Compounds used in the invention can be readily processed and are thermally stable to such an extent that they can be vaporized. The compounds possess significant volatility, so that vapor phase deposition, where desired, is readily achieved. Such compounds can be deposited onto substrates by vacuum sublimation or by solvent processing, including dip coating, drop casting, spin coating, blade coating.

Deposition by a rapid sublimation method is also possible. One such method is to apply a vacuum of 35 mtorr to a chamber containing a substrate and a source vessel that holds the compound in powdered form, and heat the vessel over several minutes until the compound sublimes onto the substrate. Generally, the most useful compounds form well-ordered films, with amorphous films being less useful.

Alternatively, for example, the compounds described above can first be dissolved in a solvent prior to spin-coating or printing for deposition on a substrate.

Devices in which the n-channel semiconductor films of the invention are useful include especially thin film transistors (TFTs), especially organic field effect thin-film transistors. Also, such films can be used in various types of devices having organic p-n junctions, such as described on pages 13 to 15 of US 2004/0021204 A1 to Liu et al., which patent application publication is hereby incorporated by reference.

Electronic devices in which TFTs and other devices are useful include, for example, more complex circuits, e.g., shift registers, integrated circuits, logic circuits, smart cards, memory devices, radio-frequency identification tags, backplanes for active matrix displays, active-matrix displays (e.g. liquid crystal or OLED), solar cells, ring oscillators, and complementary circuits, such as inverter circuits, for example, in combination with other transistors made using available p-type organic semiconductor materials such as pentacene. In an active matrix display, a transistor according to the present invention can be used as part of voltage hold circuitry of a pixel of the display. In devices containing the TFTs of the present invention, such TFTs are operatively connected by means known in the art.

The present invention further provides a method of making any of the electronic devices described above. Thus, the present invention can be embodied in an article that comprises one or more of the TFTs described.

EXAMPLES

A. Material Synthesis

The synthesis of arylimidazole-based compounds has been described in GB 925,409. In accordance with the invention, a mixture of perylene tetracarboxylic acid dianhydride, such as perylene tetracarboxylic acid dianhydride or naphthalene tetracarboxylic acid dianhydride, which is available from Aldrich Chemical Company, 2.5 equivalents of ortho-diamino compound such as 1,2-phenylene diamine (for the Control), 4-fluorine-1,2-phenylene diamine for Compounds 13A and 13B (a perylene) or Compounds 37A and 37B (a naphthalene, fluorinated 3,4-diamino pyridine, etc.; zinc acetate in catalytic amounts, and 10-15 ml of quinoline per gram of dianhydride molecule was heated over 4-5 hours at a temperature of ca. 220° C. The mixture is allowed to cool to room temperature and poured into an excess amount of methanol and the precipitated solids are collected, filtered and washed with water, methanol and acetone. The solid is then purified by train sublimation at $10^{-5}$ to $10^{-6}$ torr. The purified materials contain mixture of cis- and trans-isomers such as compound 1 (cis) and compound 2 (trans).

The following comparison compounds were prepared and tested in the following examples:

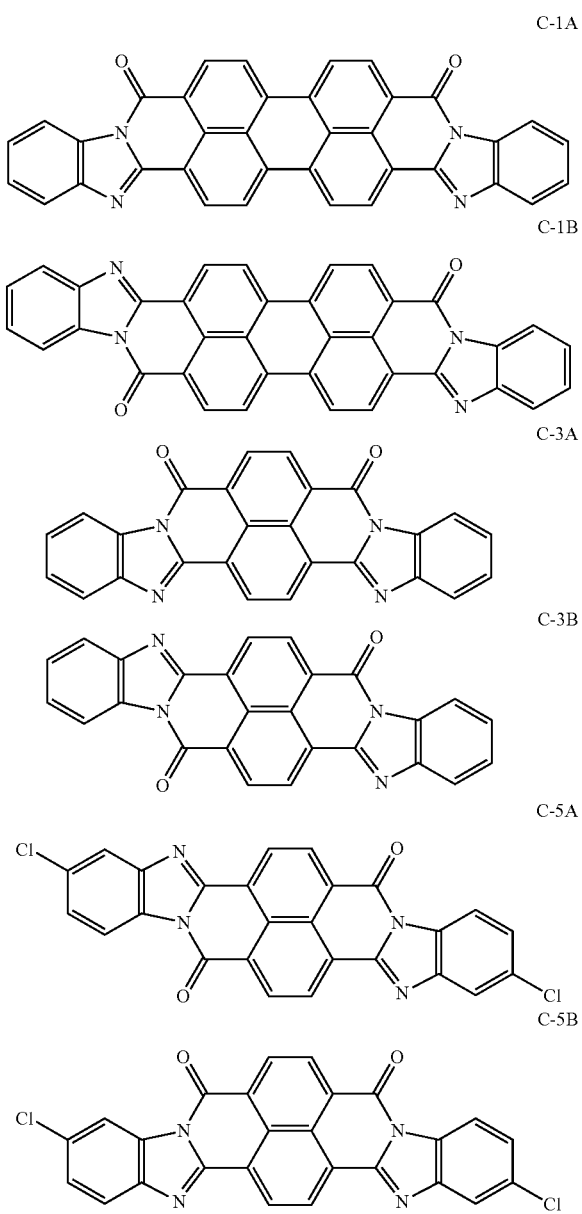

B. Device Preparation

In order to test the electrical characteristics of the various materials of this invention, field-effect transistors were typically made using the top-contact geometry. The substrate used is a heavily doped silicon wafer, which also serves as the gate of the transistor. The gate dielectric is a thermally grown $SiO_2$ layer with a thickness of 165 nm. It has been previously shown for both p-type and n-type transistors that electrical properties can be improved by treating the surface of the gate dielectric. For most of the experiments described here, the oxide surface was treated with a thin (<10 nm), spin-coated polymer layer, or a self-assembled monolayer (SAM) of octadecyltrichlorosilane (OTS). Typically, an untreated oxide sample was included in the experiments for comparison.

The active layer of arylimidazole-based compound was deposited via vacuum deposition in a thermal evaporator. The deposition rate was 0.1 Angstroms per second while the substrate temperature was held at 75° C. for most experiments. The thickness of the active layer was a variable in some experiments, but was typically 40 nm. Silver contacts of thickness 50 nm were deposited through a shadow mask. The channel width was held at 500 microns, while the channel lengths were varied between 20 and 80 microns. Some experiments were performed to look at the effect of other contact materials. A few devices were made with a bottom-contact geometry, in which the contacts were deposited prior to the active material.

C. Device Measurement and Analysis

Electrical characterization of the fabricated devices was performed with a Hewlett Packard HP 4145b parameter analyzer. The probe measurement station was held in a positive $N_2$ environment for all measurements with the exception of those purposely testing the stability of the devices in air. The measurements were performed under sulfur lighting unless sensitivity to white light was being investigated. The devices were exposed to air prior to testing.

For each experiment performed, between 4 and 10 individual devices were tested on each sample prepared, and the results were averaged. For each device, the drain current (Id) was measured as a function of source-drain voltage (Vd) for various values of gate voltage (Vg). For most devices, Vd was swept from 0 V to 80 V for each of the gate voltages measured, typically 0 V, 20 V, 40 V, 60 V, and 80 V. In these measurements, the gate current (Ig) was also recorded in to detect any leakage current through the device. Furthermore, for each device the drain current was measured as a function of gate voltage for various values of source-drain voltage. For most devices, Vg was swept from 0 V to 80 V for each of the drain voltages measured, typically 40 V, 60 V, and 80 V.

Parameters extracted from the data include field-effect mobility (µ), threshold voltage (Vth), sub-threshold slope (S), and the ratio of Ion/Ioff for the measured drain current. The field-effect mobility was extracted in the saturation region, where Vd>Vg–Vth. In this region, the drain current is given by the equation (see Sze in *Semiconductor Devices—Physics and Technology*, John Wiley & Sons (1981)):

$$I_d = \frac{W}{2L}\mu C_{ox}(V_g - V_{th})^2$$

where W and L are the channel width and length, respectively, and $C_{ox}$ is the capacitance of the oxide layer, which is a function of oxide thickness and dielectric constant of the material. Given this equation, the saturation field-effect mobility was extracted from a straight-line fit to the linear portion of the $\sqrt{I_d}$ versus Vg curve. The threshold voltage, $V_{th}$, is the x-intercept of this straight-line fit. Mobilities can also be extracted from the linear region, where Vd<Vg−Vth. Here the drain current is given by the equation (see Sze in *Semiconductor Devices—Physics and Technology*, John Wiley & Sons (1981)):

$$I_d = \frac{W}{2L} \mu C_{ox} \left[ V_d(V_g - V_{th}) - \frac{V_d^2}{2} \right]$$

For these experiments, mobilities in the linear regime were not extracted, since this parameter is very much affected by any injection problems at the contacts. Non-linearities in the curves of $I_d$ versus $V_d$ at low $V_d$ indicate that the performance of the device is limited by injection of charge by the contacts. In order to obtain results that are more independent of contact imperfections of a given device, the saturation mobility rather than the linear mobility was extracted as the characteristic parameter of device performance.

The log of the drain current as a function of gate voltage was plotted. Parameters extracted from the log $I_d$ plot include the $I_{on}/I_{off}$ ratio and the sub-threshold slope (S). The $I_{on}/I_{off}$ ratio is simply the ratio of the maximum to minimum drain current, and S is the inverse of the slope of the $I_d$ curve in the region over which the drain current is increasing (i.e. the device is turning on).

D. Results

Following examples demonstrate that arylimidazole-based compounds can be used as n-channel semiconducting materials for TFT having high mobility and on/off ratio.

Example 1

A heavily doped silicon wafer with a thermally grown $SiO_2$ layer with a thickness of 165 nm was used as the substrate. The wafer was cleaned for 10 minutes in a piranah solution, followed by a 6-minute exposure in a UV/ozone chamber. The cleaned surface was then treated with a self-assembled monolayer of octadecyltrichlorosilane (OTS), made from a heptane solution under a humidity-controlled environment. Water contact angles and layer thicknesses were measured to ensure the quality of the treated surface. Surfaces with a good quality OTS layer have water contact angles >90°, and thicknesses determined from ellipsometry in the range of 27 Å to 35 Å.

The purified arylimidazole-based compound, a mixture of Compound 1 and 2 as semiconducting material was deposited by vacuum sublimation at a pressure of $5 \times 10^{-7}$ Torr and a rate of 0.1 Angstroms per second to a thickness of 40 nm as measured by a quartz crystal. During deposition the substrate was held at a constant temperature of 60° C. The sample was exposed to air for a short time prior to subsequent deposition of Ag source and drain electrodes through a shadow mask to a thickness of 50 nm. The devices made had a 500 micron channel width, with channel lengths varying from 20-80 microns.

The devices were exposed to air prior to measurement in a nitrogen atmosphere using a Hewlett-Packard 4145B semiconductor parameter analyzer. The field effect mobility, μ, was calculated from the slope of the $(I_D)^{1/2}$ versus $V_G$ plot (left y-axis) to be $6.6 \times 10^{-3}$ cm²/Vs in the saturation region. The on/off ratio was $8.5 \times 10^3$ and the threshold voltage $V_T$=53 V. Similar saturation mobilities of were measured from similar devices prepared in this way.

Example 2-5

Samples were prepared and tested as in Example 1, except a different arylimidazole-based material was used as active semiconducting material for the TFT. The results are summarized in Table 1.

TABLE 1

| Examples | Active TFT Material (Compound Number) | μ (cm²/Vs) | σ (μ) | $V_{th}$ (V) | σ ($V_{th}$) | $I_{on}/I_{off}$ |
|---|---|---|---|---|---|---|
| Comparison 1 | C-1A, C-1B | $6.6 \times 10^{-3}$ | $2.3 \times 10^{-3}$ | 53.28 | 13.89 | $8.5 \times 10^3$ |
| 2 | 13A, 13B | $3.4 \times 10^{-2}$ | $2.7 \times 10^{-3}$ | 15.83 | 2.29 | $9.1 \times 10^5$ |
| Comparison 3 | C-3A, C-3B | $1.6 \times 10^{-3}$ | $6.4 \times 10^{-4}$ | 61.90 | 28.8 | $1.7 \times 10^4$ |
| 4 | 37A, 37B | $7.6 \times 10^{-2}$ | $2.1 \times 10^{-2}$ | 37.46 | 8.30 | $2.0 \times 10^6$ |
| Comparison 5 | C-5A, C-5B | $3.2 \times 10^{-2}$ | $1.2 \times 10^{-2}$ | 53.33 | 2.67 | $8 \times 10^5$ |

These examples clearly demonstrate the advantage of inventive Compounds 37-A/B and 13-A/B as n-type materials. Accordingly, mobility, $V_{th}$ and the on/off ratio are improved over Comparative Examples 3 and 5, clearly demonstrating the advantageous effect of the fluorine substitution in the above-described aryl dicarboxylic diimidazole-based compounds on device performance.

The invention has been described in detail with particular reference to certain preferred embodiments thereof, but it will be understood that variations and modifications can be effected within the spirit and scope of the invention.

The invention claimed is:

1. A process for fabricating a thin film semiconductor device, comprising, not necessarily in the following order, the steps of
    (a) depositing, onto a substrate, a thin film of organic semiconductor material that comprises an organic semiconductor material that comprises one or more aryl dicarboxylic diimidazole-based compounds such that the film exhibits a field effect electron mobility that is greater than 0.005 cm²/Vs;
    (b) forming a spaced apart source electrode and drain electrode, wherein the source electrode and the drain electrode are separated by, and electrically connected with, the n-channel semiconductor film; and
    (c) forming a gate electrode spaced apart from the semiconductor material,
    wherein the organic semiconductor material is a compound represented by one of the following structures:

(I-A)
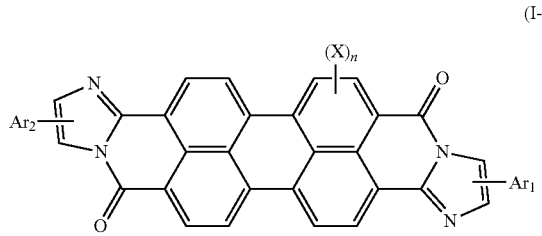

(I-B)
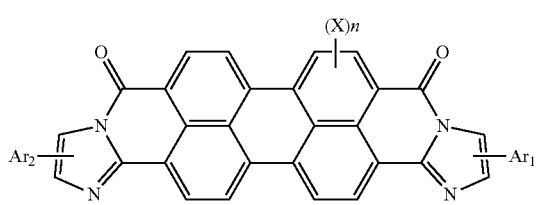

(II-A)
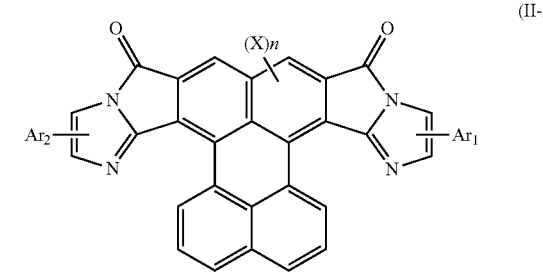

(II-B)
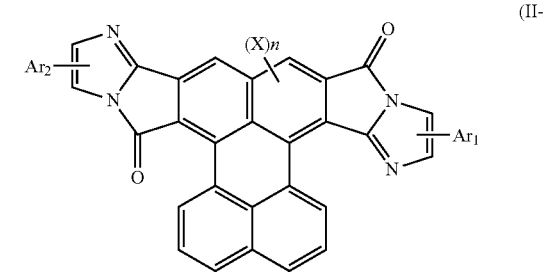

(III-A)
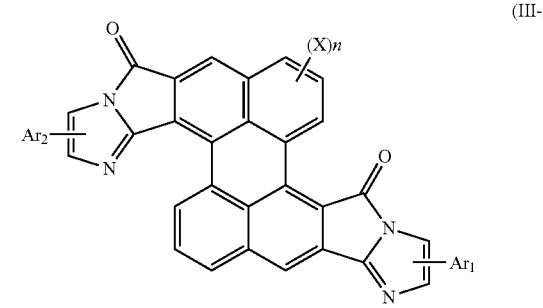

(III-B)
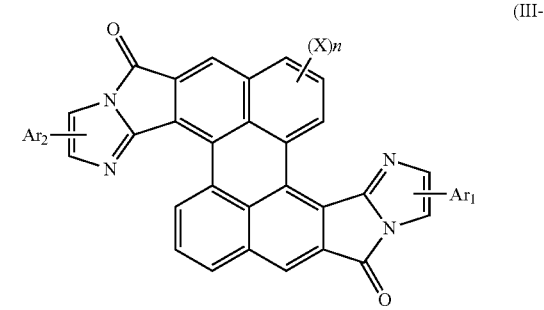

(IV-A)
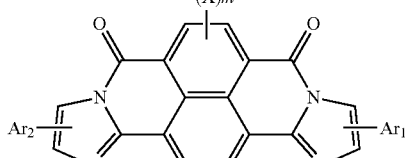

(IV-B)
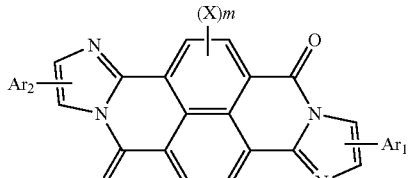

(V-A)
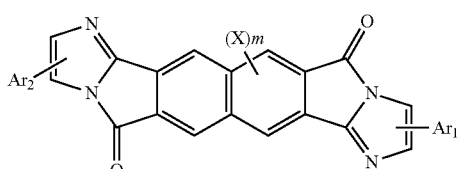

(V-B)
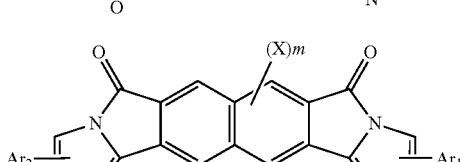

wherein $Ar_1$ and $Ar_2$ are the same or different, and are each carbocyclic or heterocyclic aromatic ring systems fused to each corresponding adjacent imidazole in the structure, wherein each of $Ar_1$ and $Ar_2$ are substituted with one or more fluorine atoms, X is an optional organic or inorganic substituent group at any available position on the core nucleus, n is zero or an integer from 1 to 8, and m is zero or an integer from 1 to 4.

2. The process of claim 1 wherein the compound is deposited on the substrate by sublimation or by solution-phase deposition and wherein the substrate has a temperature of no more than 150° C. during deposition.

3. The process of claim 1 comprising, not necessarily in order, the following steps:
 (a) providing a support;
 (b) providing a gate electrode material over the substrate;
 (c) providing a gate dielectric over the gate electrode material;
 (d) depositing the thin film of organic semiconductor material over the gate dielectric; and
 (e) providing a source electrode and a drain electrode contiguous to the thin film of organic semiconductor material.

4. The process of claim 1 wherein the support is flexible carried out in its entirety below a peak temperature of 100° C. to produce an integrated circuit comprising a plurality of thin film transistors.

5. The process of claim 1 wherein the thin film is deposited using sublimation.

6. The process of claim 1 wherein the thin film is deposited out of a solvent solution.

7. The process of claim 1 wherein the substrate has a temperature during deposition of from 25° C. to 70° C.

8. The process of claim 1 wherein the thin film is deposited by ink jet printing.

9. The process of claim 1 wherein the thin film is deposited by vapor phase deposition.

10. The process of claim 1 wherein the thin film semiconductor device is further provided with first and second contact means in spaced apart contact with the thin film and third contact means spaced apart from the organic semiconductor material.

11. The process of claim 1 wherein the $Ar_1$ and $Ar_2$ moieties are single rings or fused aromatic polycyclic ring systems, including carbocyclic, heterocyclic, or hybrid ring systems in which a carbocylic ring is fused to a carbocyclic ring.

12. The process of claim 1 wherein X is independently selected from alkyl groups, alkenyl groups, alkoxy groups, halogens, cyano, substituted or unsubstituted aryl and arylalkyl groups.

13. The process of claim 1 wherein X is independently cyano or fluorine or any combinations thereof.

14. The process of claim 1 wherein the $Ar_1$ and $Ar_2$ moieties each independently comprise two or more fluorines substituted on each of the $Ar_1$ and $Ar_2$ moieties.

15. The process of claim 1 wherein the $Ar_1$ and $Ar_2$ moieties each independently comprise a benzene, naphthalene, thiophene, quinoline or pyridine ring system each substituted with one or more fluorines.

16. The process of claim 1 wherein the organic semiconducting material is capable of exhibiting electron mobility greater than 0.05 $cm^2/Vs$.

17. The process of claim 1 further comprising incorporating the thin film semiconductor device into an electronic device selected from the group consisting of integrated circuits, active-matrix display, and solar cells.

18. The process of claim 17 comprising incorporating a multiplicity of thin film semiconductor devices into the electronic device.

* * * * *